United States Patent [19]
Haynes et al.

[11] Patent Number: 5,278,509
[45] Date of Patent: Jan. 11, 1994

[54] METHOD FOR MONITORING BATTERY DISCHARGE BY DETERMINING THE SECOND DERIVATIVE OF BATTERY VOLTAGE OVER TIME

[75] Inventors: Richard Haynes, East Windsor, N.J.; Robert B. Levy, Morrisville, Pa.

[73] Assignee: AT&T Bell Laboratories, Murray Hill, N.J.

[21] Appl. No.: 829,635

[22] Filed: Feb. 3, 1992

[51] Int. Cl.⁵ .................. G01N 27/416; H02J 7/04
[52] U.S. Cl. ................................. 324/427; 324/426; 320/48; 340/636
[58] Field of Search ............... 324/426, 433, 427, 429; 340/636; 320/48, 21, 31, 39; 429/197

[56] References Cited

U.S. PATENT DOCUMENTS

| | | | |
|---|---|---|---|
| 4,741,979 | 5/1988 | Faust et al. | 429/197 X |
| 4,804,595 | 2/1989 | Bakos et al. | 429/197 X |
| 5,027,294 | 6/1991 | Fakruddin et al. | 324/426 X |
| 5,166,623 | 11/1992 | Ganio | 324/427 |

OTHER PUBLICATIONS

"Energy-Management Chip Supplements PC Power-- Control ICs, " D. Bursky, *Electronic Design News*, Jun. 27, 1991, pp. 125–129.

"New Batteries and Support Components Widen Prototype Designer's Options, " *Electrical Engineering Product News*, May 1991, pp. 38–39.

Primary Examiner—Gerard R. Strecker
Assistant Examiner—Diep Do
Attorney, Agent, or Firm—Robert B. Levy

[57] ABSTRACT

The state of charge of a rechargeable battery (12), such as those made from lithium, nickel-cadmium or metal hydrides, can be accurately determined by monitoring the rate of change of battery voltage over time (dv/dt), which parameter has empirically been found to change dramatically as the battery reaches complete discharge.

6 Claims, 3 Drawing Sheets 5,278,509

METHOD FOR MONITORING BATTERY DISCHARGE BY DETERMINING THE SECOND DERIVATIVE OF BATTERY VOLTAGE OVER TIME

TECHNICAL FIELD

This invention relates to a technique for monitoring the discharge of a battery to maximize the energy withdrawn from the battery prior to cutoff.

BACKGROUND OF THE INVENTION

Virtually all portable electronic equipment, such as cordless and cellular telephones, lap-top computers, and facsimile machines, utilize one or more rechargeable batteries to supply the energy necessary to operate the equipment. Typically, the rechargeable batteries now used in present-day portable electronic equipment include those made from nickel-cadmium, lithium, lead-acid and metal hydrides. With such present-day rechargeable batteries, care must be taken not to over discharge the batteries during use. Otherwise, damage to the battery and/or the equipment may occur. For this reason, virtually all pieces of battery-operated portable electronic equipment include a monitoring circuit which operates to monitor the state of battery charge and to cut off the battery (i.e., interrupt the passage of current) once the charge drops below critical voltage.

At present, such monitoring circuits operate to determine the battery charge by sensing the magnitude of battery voltage. Once the battery voltage reaches a particular value (corresponding to the critical charge level), the battery is cut off. The cutoff battery voltage is typically set to provide a sufficient margin of safety so that the battery is cut off before any damage may be incurred. Unfortunately, battery voltage, under all conditions, is not a sufficiently sensitive measure of battery charge and for that reason, the cutoff voltage is usually set high enough to assure that, under worst-case conditions, the battery will be cut off before the charge drops below the critical value. As a consequence, under normal conditions, the charge level may not fall below the critical level once the cutoff voltage is reached, thereby reducing the potential amount of energy that may be withdrawn from the battery.

Thus, there is a need for a more accurate technique for sensing battery charge which maximizes the available amount of battery energy and increases the safety of the battery.

SUMMARY OF THE INVENTION

Briefly, in accordance with the invention, there is provided a technique for monitoring the state of charge of a battery which is more sensitive than prior art techniques. In accordance with the invention, the rate of change of battery voltage over time (mathematically expressed as dv/dt) is monitored during battery discharge. As the rate of change of the battery voltage over time begins to change significantly (indicating a drop in battery charge to a critical level), the battery is cut off. In this way, the amount of available battery energy available prior to battery cutoff is maximized, while still avoiding damage caused by the charge level falling below a critical value.

DETAILED DESCRIPTION

Figure 1:
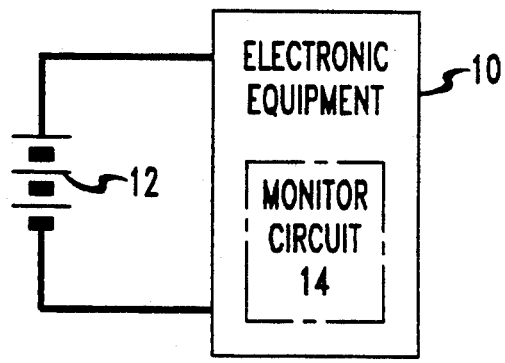
FIG. 1 is a block diagram of a piece of portable electronic equipment powered by a rechargeable battery, in accordance with the prior art.

Referring to FIG. 1, there is shown a block schematic of a prior-art, portable electronic system 10 within which is a battery 12, typically of the rechargeable variety, for supplying energy to the system. The system 10 may comprise a cordless or cellular telephone, lap-top computer, or portable printer or facsimile machine, for example. The battery 12 may be made from lithium, nickel-cadmium, a metal hydride, or, in fact, may be any battery where rapid changes of the voltage indicate depletion of reactants.

Within the system 10 is an electronic circuit 14 which operates to monitor the state of charge of the battery 12, by monitoring the battery voltage, and to cut off the battery before the charge level reaches a critical level at which damage may occur. While the voltage of the battery 12 does provide a measure of its charge, it is not a sufficiently sensitive measure under all conditions. As a consequence, the circuit 14 is invariably designed to cut off the battery 12 at a high enough voltage to provide a sufficient margin of safety under worst-case conditions. Under normal conditions, the battery 12 is likely to be cut off even though the level of charge is above the critical level, thereby reducing the amount of battery energy that is available.

Figure 2:
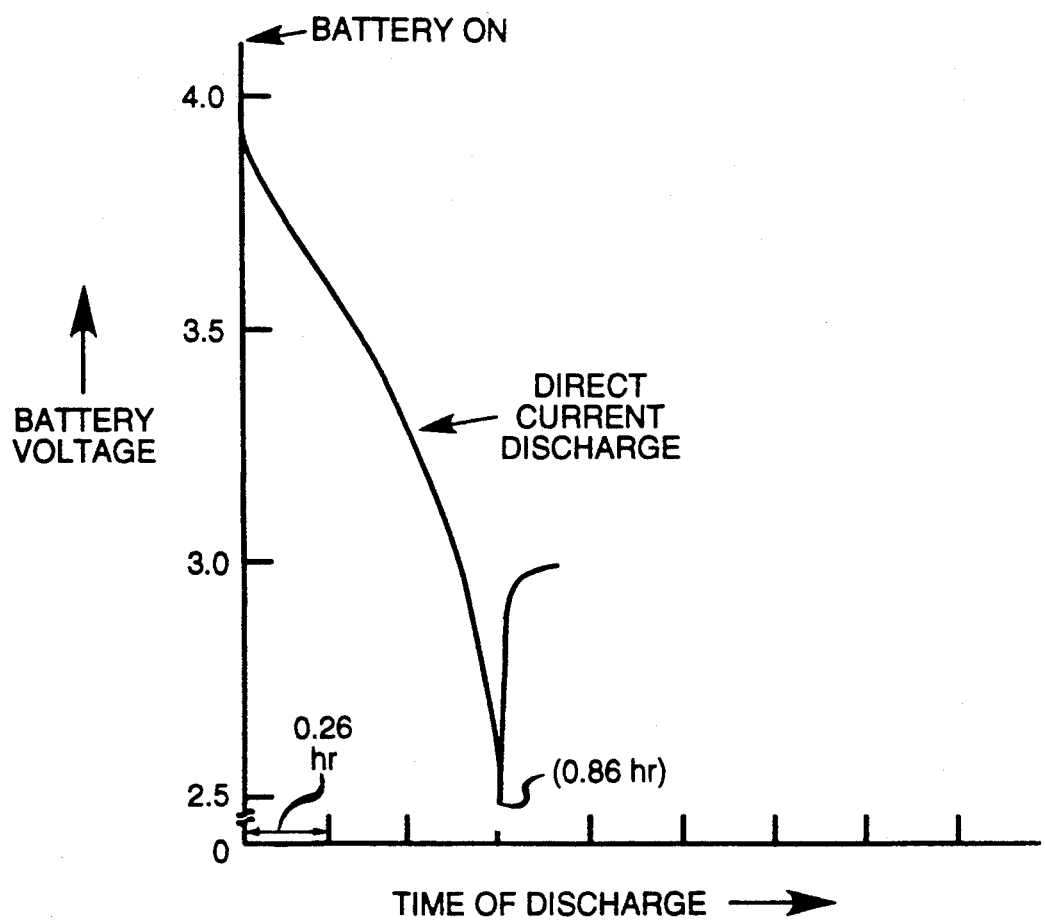
FIG. 2 is a plot of the voltage of the battery of FIG. 1 vs time as for a constant discharge current.
Figure 3:
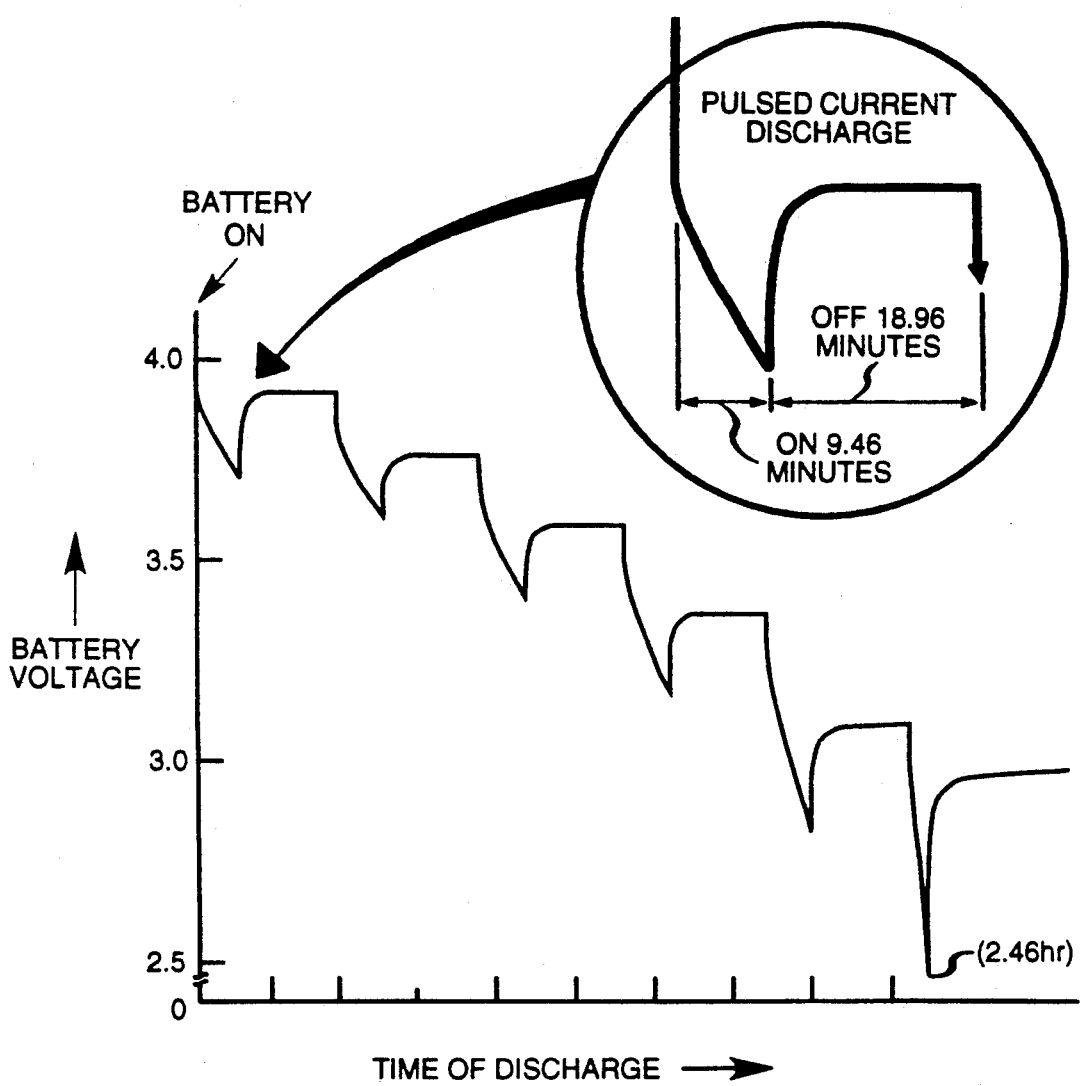
FIG. 3 is a plot of the voltage of the battery of FIG. 1 versus time for pulsed discharge current.

To overcome this disadvantage, I have conceived of a technique for monitoring the state of charge of the battery 12 which makes use of a parameter far more sensitive than battery voltage. To understand my technique, reference should be had first to FIGS. 2 and 3. FIG. 2 depicts a plot of battery voltage versus time for a constant discharge current of 400 ma drawn from the battery 12, which in a preferred embodiment comprises a Sony model BC 1010 lithium ion rechargeable battery. FIG. 3 is a plot of battery voltage versus time for the battery 12 under the condition of pulsed discharge wherein the battery is discharged at 400 ma during periodic 9.46-minute intervals, with each such discharge interval followed by an interval of 18.96 minutes during which no discharge occurs. The constant discharge of the battery 12, as plotted in FIG. 2, was carried out using a PARC Model 173 Potentiostat/Galvanostat while a PARC model 379 Digital Coulometer was utilized to measure the battery charge (both not shown). The same two pieces of equipment, together with a PARC Model 175 Universal Programmer Waveform Generator (not shown) were utilized to carry out the pulsed discharge of the battery 12 as plotted in FIG. 3.

At the outset of both constant and pulsed discharge, the voltage of the battery 12 was approximately 4.15 volts. Both constant and pulsed discharge of the battery 12 was carried out until the battery voltage reached 2.5 volts, the manufacturer's recommended cutoff voltage, which occurred after an interval of 0.86 hours during constant discharge and after 2.46 hours during pulsed discharge, as seen in FIGS. 2 and 3, respectively. After the battery 12 discharging ceased, the battery voltage eventually returned to an equilibrium level of approximately 3.0 volts.

Figure 4:
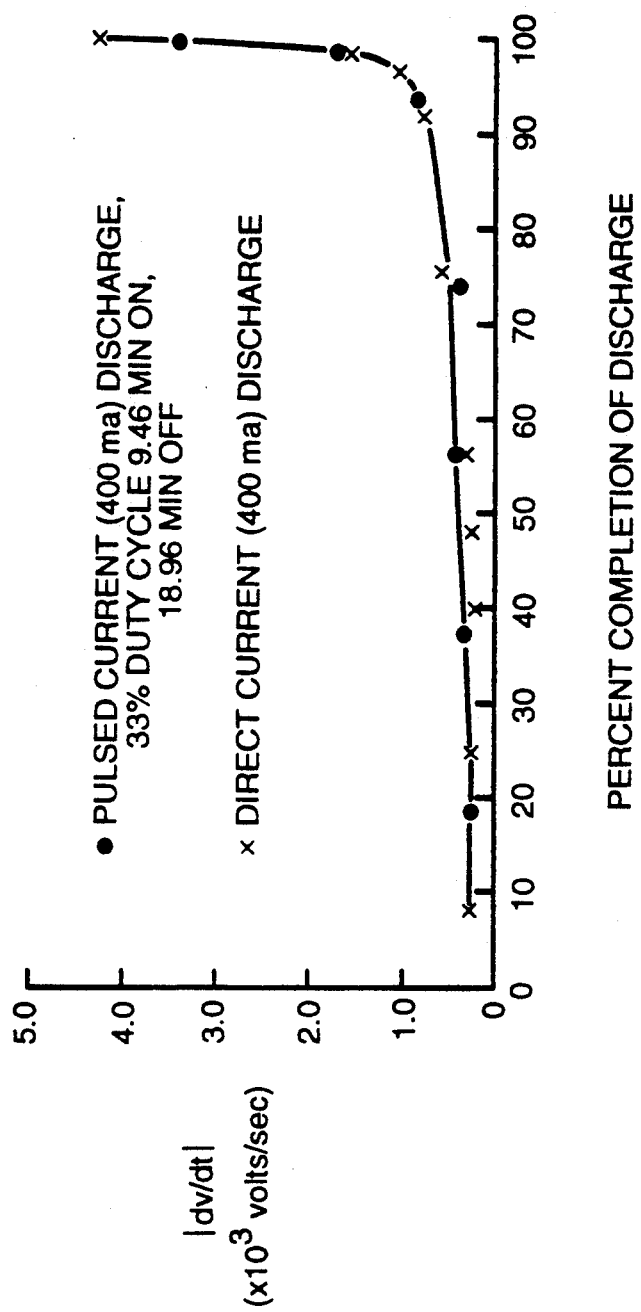
FIG. 4 is a plot of the rate of change of battery voltage over time versus percentage completion of discharge for the battery of FIG. 1.

Each successive value of dv/dt plotted in FIG. 4 for the condition of pulsed discharge illustrated in FIG. 2 was obtained from the ratio of $(V_{oni}-V_{oni+1}/(t_i-t_{i+1})$ where $t_i$ and $t_{i+1}$ are successive intervals in time and $V_{oni}$ and $V_{oni+1}$ are successive "on" voltages of the battery 12 (the voltage during actual discharge) at $t_i$ and $t_{i+1}$ respectively. By the same token, each successive value of dv/dt could also be obtained from a ratio of $(V_{offi}-V_{offi+1})$ $(t_i-t_{i+1})$ where $V_{offi}$ and $V_{offi+1}$ are successive "off" voltages (the off voltage being the steady state battery voltage during an interval of non-discharge) as measured at $t_i$ and $t_{i+1}$, respectively.

FIG. 4 is a plot of the value of the change in voltage over time (mathematically expressed as dv/dt) of the battery 12 versus percentage completion of discharge. Typically, under most conditions, dv/dt for the battery 12 will be negative, but for ease of illustration, the absolute value has been shown. I discovered that the relationship between dv/dt for the battery 12 of FIG. 1 during discharge versus percentage completion of discharge was about the same regardless of whether the battery was undergoing constant or pulsed discharge. Such a relationship was found to be true for various duty cycles, on and off periods and total periods of the pulse discharge cycle. The change of battery voltage over time versus percentage completion of discharge was plotted for other types of batteries (such plots not being reproduced here) and similar results were obtained. (However, for each battery type, a distinctive relationship between dv/dt and percentage completion of discharge will exist.)

From the plot of FIG. 4, I have also discovered that the value of dv/dt for the battery 12 during discharge begins to change very rapidly as the battery reaches nearly complete (100%) discharge, regardless of the manner of battery discharge. As shown in FIG. 3, for the particular type of battery 12 chosen for testing, the absolute value of dv/dt rose nearly fourfold as the battery was discharged from 90% to nearly 100% of its total charge.

Having discovered that the relationship between dv/dt and percentage completion of battery discharge remains about the same regardless of the manner of discharge, and that dv/dt changes very rapidly as the battery reaches full discharge, I have concluded that dv/dt can serve as a sensitive measure of battery charge for any type of battery where rapid changes in voltage indicate a depletion of reactants. By knowing the relationship between dv/dt and the percentage discharge for a given type of battery 12, the amount of energy withdrawn from the battery can be maximized by monitoring dv/dt during discharge and then cutting off the battery when dv/dt changes to a value at which the battery is discharged to a critical level. As an example, for the particular battery 12 plotted in FIG. 4 the battery discharge is typically cut off prior to the absolute value of dv/dt reaching a magnitude corresponding to 95% discharge.

Moreover, there is another distinct advantage to monitoring the rate of change of the battery 12 voltage over time (dv/dt) to ascertain the level of battery charge. Depending on the nature of the portable electronic system 12, it often necessary to undertake certain system operations in advance of cutoff of the battery 12 to save data within the system. The timing of such operations is critical. These operations, referred to as termination operations, must usually be initiated sufficiently in advance of cutoff of the battery 12 to assure that enough energy exists to power the electronic system 12 for a long enough interval to complete such operations. Otherwise, the data sought to be retained may be lost. On the other hand, initiating termination operations too far in advance of actual cutoff of the battery 12 of FIG. 1 reduces the operating duration of the equipment 10, which is undesirable.

By monitoring dv/dt for the battery 12 during discharge, the change in dv/dt over time [d/dt(dv/dt)] can be established to ascertain how fast dv/dt is changing. From a knowledge of how fast dv/dt is changing, the amount of time elapsing before dv/dt reaches a critical value (corresponding to a critical level of battery charge) can be calculated. A knowledge of how long an interval will elapse before dv/dt reaches a critical value allows the necessary termination operations to be performed by the equipment 10 in a sufficiently timely manner to assure retention of the desired data, yet maximize equipment operation. In this way, the need for a backup battery can be eliminated.

The foregoing discloses a technique for monitoring the state of charge of a rechargeable battery 12 by monitoring the rate of change of battery voltage over time (dv/dt) in order to effectuate battery cutoff when the charge reaches a critical level which corresponds to a particular value of dv/dt.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for monitoring the state of charge of a battery undergoing discharge in an electronic system, comprising the steps of:
   monitoring the rate of change of battery voltage (dv/dt) over time;
   establishing the rate at which dv/dt for the battery changes;
   determining from the rate at which dv/dt for the battery changes, the time interval before dv/dt reaches a prescribed level corresponding to a critical value of battery charge; and
   cutting off battery discharge, at the end of said time interval, when the value of dv/dt reaches the level corresponding to a critical value of battery charge.

2. The method according to claim 1 wherein the electronic system undertakes at least one termination operation within the time interval before the battery charge reaches a critical level.

3. The method according to claim 1 wherein the battery discharge is cut off prior to the absolute value of dv/dt exceeding a value corresponding to 95% discharge of the battery.

4. The method according to claim 1 wherein the battery is undergoing pulsed discharge.

5. The method according to claim 1 wherein the pulsed discharges are periodic.

6. The method according to claim 1 wherein the battery is undergoing constant discharge.

* * * * *